(12) United States Patent
Naffziger et al.

(10) Patent No.: US 6,583,650 B2
(45) Date of Patent: *Jun. 24, 2003

(54) LATCHING ANNIHILATION BASED LOGIC GATE

(75) Inventors: Samuel D Naffziger, Ft Collins, CO (US); Jayen J Desai, Fort Collins, CO (US); Reid James Riedlinger, Fort Collins, CO (US)

(73) Assignee: Hewlett-Packard Development Company, Houston, TX (US)

( * ) Notice: Subject to any disclaimer, the term of this patent is extended or adjusted under 35 U.S.C. 154(b) by 51 days.

This patent is subject to a terminal disclaimer.

(21) Appl. No.: 09/989,230

(22) Filed: Nov. 20, 2001

(65) Prior Publication Data

US 2002/0030512 A1 Mar. 14, 2002

Related U.S. Application Data

(63) Continuation of application No. 09/510,975, filed on Feb. 21, 2001, now Pat. No. 6,459,304.

(51) Int. Cl.[7] .................. H03K 19/0948; H03K 19/096
(52) U.S. Cl. .......................... 326/121; 326/98; 326/108
(58) Field of Search ...................... 326/93–98, 105–108, 326/121, 112, 119

(56) References Cited

U.S. PATENT DOCUMENTS

| 3,935,474 | A | 1/1976 | Komarek ................... 307/205 |
|---|---|---|---|
| 4,700,086 | A | 10/1987 | Ling et al. ................... 307/443 |
| 4,899,066 | A | 2/1990 | Aikawa et al. ............ 307/45.2 |
| 5,291,076 | A | 3/1994 | Bridges et al. ............. 307/449 |
| 5,831,452 | A | 11/1998 | Nowak et al. ................ 326/98 |
| 5,903,169 | A | 5/1999 | Kong .......................... 326/95 |
| 5,990,706 | A | 11/1999 | Matsumoto et al. .......... 326/98 |
| 6,043,696 | A | 3/2000 | Klass et al. ................. 327/211 |
| 6,052,008 | A | 4/2000 | Chu et al. ................... 327/200 |
| 6,121,796 | A | 9/2000 | Ciraula et al. ................ 326/98 |
| 6,172,531 | B1 | 1/2001 | Aipperspach et al. ....... 326/108 |
| 6,184,718 | B1 | 2/2001 | Tran et al. .................. 326/121 |

FOREIGN PATENT DOCUMENTS

JP          04372222 A     12/1992     ................. 326/98

OTHER PUBLICATIONS

U.S. patent application Ser. No. 09/561,081, Arnold, filed Apr. 28, 2000.

*Primary Examiner*—Don Le

(57) ABSTRACT

The present invention provides a precharge circuit that has a first precharged node, a second precharged node, and a latch device. The first precharged node is charged to a high value during a precharge state. In response to a transition from the precharge state to an evaluate state, it either discharges to a low value or remains charged at its high value. The second precharged node has a value in the evaluate state that is based on the value of the first precharged node upon the circuit transitioning to the evaluate state. The latch device is connected to the second precharged node for latching this value in the evaluate state. With the latching device, this value is not affected by the first precharged node once the circuit has sufficiently transitioned to the evaluate state.

23 Claims, 4 Drawing Sheets

LATCHING ANNIHILATION BASED LOGIC GATE

RELATED APPLICATION

The present application is a continuation of commonly assigned co-pending and U.S. patent application Ser. No. 09/510,975 entitled "A LATCHING ANNIHILATION BASED LOGIC GATE", filed Feb. 21, 2001 now U.S. Pat. No. 6,459,304, the disclosure of which is hereby incorporated herein by reference.

TECHNICAL FIELD

The present invention generally relates to digital computing systems, and more specifically to precharge devices.

BACKGROUND

Precharge devices are synchronous logic circuits that generate an output depending upon a predetermined combination of inputs for implementing a logical function. Two common uses for precharge devices are as decoders and as comparators. Decoders output a unique signal (high or low) if and only if all of the bits of an input match a predetermined set of values. A decoder may thereby enable a particular write line in a matrix of memory cells if and only if an input memory address matches the predetermined address of a line of memory cells to which the decoder is connected. Similarly, a comparator will output a unique signal if and only if two inputs, each containing multiple data bits, are identical.

Precharge devices are characterized by two states, precharge and evaluate. In the precharge state, a node is charged to a known or predetermined voltage level. In the evaluate state, an array or "tree" of transistors configured in a basic logical function (e.g., NAND, NOR) is given the opportunity to discharge the node to a second known or predetermined voltage level or to allow the charge to persist. The logical function input signals are connected, typically, to the gates of one or more of the transistors in the logical section tree. The final charge on the node may thereby be controlled by the particular values of the inputs. The final voltage at the node, high or low, acts as the output of the precharge device after being suitably buffered and, perhaps, inverted.

Two basic logical section structures include stacked NAND and parallel NOR structures. In a stacked NAND logical section, two or more transistors are stacked in series with one another and to the precharge node. The precharged node is discharged if and only if all of the transistor gate inputs are active (e.g., high). With the parallel NOR configuration, two or more transistors are arranged in parallel with one another and across the precharged node. If any of the transistor gate inputs are active, the precharge node is discharged. In other words, the precharged node is not discharged if and only if all of the transistor gate inputs are not active. Of course, with the use of inverted or non-inverted inputs, any logical function such as a decoder may be implemented with either structure. An important concept to be understood with precharged circuits however, is monotonicity. This is a property of a signal such that it may only transition in a single direction (i.e., high to low, or low to high) during the evaluate portion of the cycle. Monotonic circuits are reset to the default value during the precharge portion of the cycle. For example, the output of a precharged NOR gate with inverted input is indeed a logical AND, but the output will have the wrong direction of transition and therefore will be unsuitable as an input to other monotonic precharged gates. For additional information relating to precharge devices, reference may be made to U.S. Pat. No. 5,291,076 to Bridges et al ("Bridges").

In high performance applications with complicated functions that require numerous inputs, the stacked NAND structure may not be practical because the time required for discharging through a relatively large stack of transistors can be prohibitive. In fact, it is usually not feasible to use stacks of more than four transistors. Thus, the parallel NOR structure is favored. However, the primary problem with NOR structures is that for monotonic logic, they can only compute OR functions, not AND functions since inverters are necessary to achieve the correct logical sense. The Bridges reference disclosed a parallel NOR device with a screening transistor, which in effect, screens the charged node of the parallel NOR section from the output section and creates a separate charged node that discharges when the parallel charged node is to persist and persists when the parallel charged node is to discharge. Bridges also disclosed a precharge device with latching transistors for improving the device's resistance to inherent circuit instabilities. Unfortunately, neither the Bridges design (nor any other design known of in the prior art) did anything for unstable logic inputs. Separate latches are needed for each input to ensure that it is sufficiently stable to ensure that the precharge output properly reflects the input states when the circuit goes from the precharge to the evaluate phase.

Accordingly, what is needed is an improved circuit that is capable of providing a stable output without the need for stable inputs throughout the evaluation phase.

SUMMARY OF THE INVENTION

These and other objects, features and technical advantages are achieved by a system and method which the present invention provides a precharge circuit that has a first precharged node, a second precharged node, and a latch device. The first precharged node is charged to a high value during a precharge state. In response to a transition from the precharge state to an evaluate state, it either discharges to a low value or remains charged at its high value. The second precharged node has a value in the evaluate state that is based on the value of the first precharged node upon the circuit transitioning to the evaluate state. The latch device is connected to the second precharged node for latching this value in the evaluate state. With the latching device, this value is not affected by the first precharged node once the circuit has sufficiently transitioned to the evaluate state.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
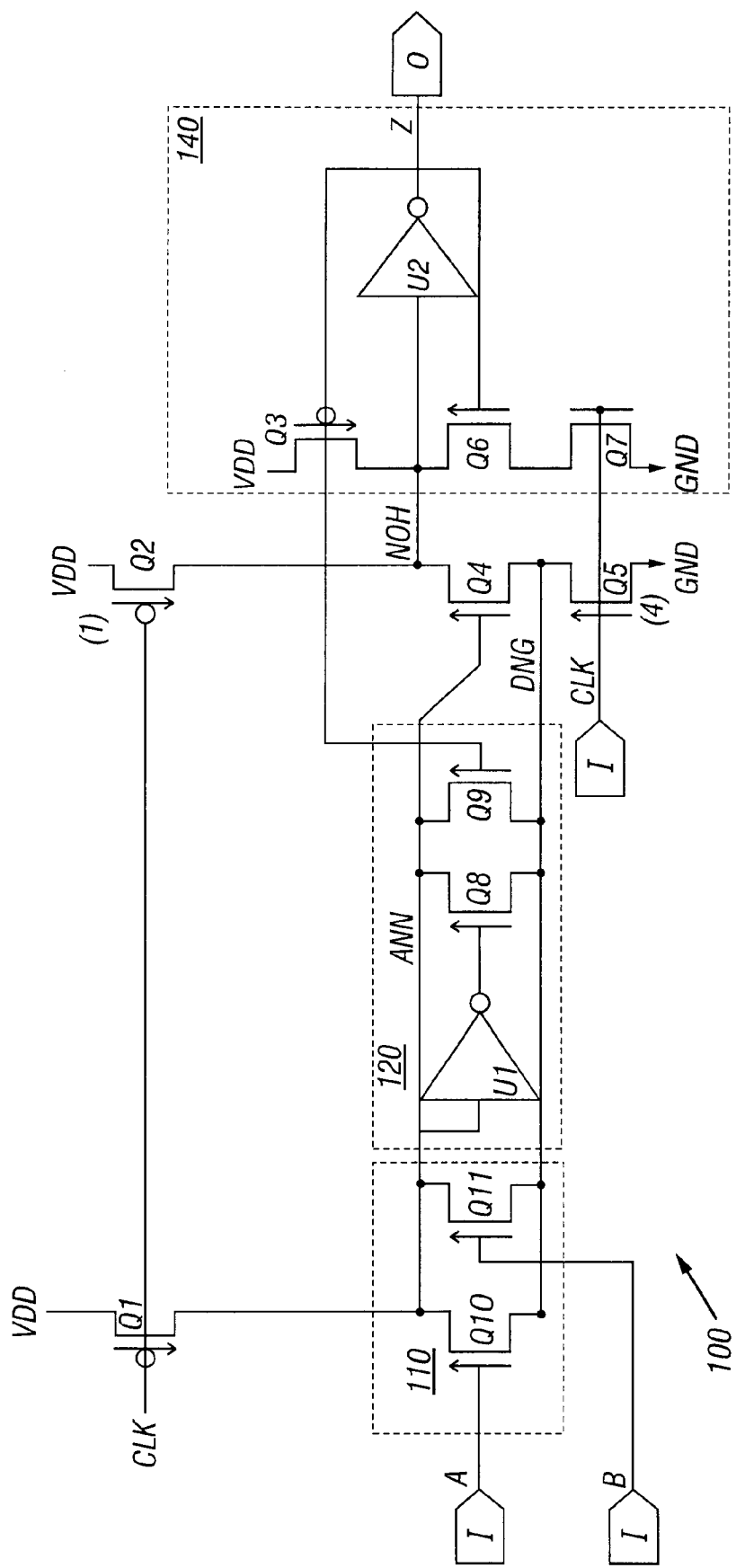
FIG. 1 schematically shows a first embodiment of the precharge circuit of the present invention.

With reference to FIG. 1, one embodiment of a precharge circuit 100 of the present invention is shown. Precharge circuit 100 performs a NOR function with inputs at A and B and an output at Z, which is monotonic. Output Z is always low in the precharge state. It can only change in one direction during the transition to the evaluate state. If circuit 100 evaluates False, Z stays low, and if it evaluates True, Z changes from low to high during the evaluate state.

Precharge device 100 includes precharge transistors Q1, Q2, evaluate transistor Q5, logic section 110, clamping section 120, screening transistor Q4, and output section 140. The logic section 110 includes transistors Q10 and Q11. The clamping section 120 includes inverter U1 and clamping transistors Q8 and Q9. The output section 140 includes high latch transistors Q6 and Q7, low latch transistor Q3, and inverter U2, which also serves as a buffer. In the depicted embodiment, each of the transistors Q1–Q11 are NFET type transistors, with the exception of Q1, Q2 and Q3, which are PFET type transistors. The specific transistors used to implement circuit 100 are not critical. However, in one embodiment, low latch transistor Q3 should be smaller than Q4 and Q5. Inverters U1 and U2 are conventional inverters that may be implemented with a conventionally stacked PFET/NFET pair.

The source of precharge PFET Q1 is connected to VDD, and its drain is connected to the node labeled "ANN", which is a precharged node of the circuit. The gate of Q1 is connected to a clock ("CLK") signal. Transistors Q10 and Q11 of logic section 110 are arranged in parallel with one another with their drains and sources connected together forming a NOR gate with inputs at a and b and an output at the ANN node. The a and b inputs are at the respective gates of transistors Q10 and Q11, and the ANN output is at their commonly connected drains. Their commonly connected sources are at the node marked "DNG."

The ANN precharged node is connected to the input of inverter U1, and the output of inverter U1 is connected to the gate of clamping transistor Q8. The drain of Q8 is connected to the ANN node, and its source is connected to the DNG node. Clamping NFET Q9 is connected in parallel across Q8, with its drain connected at the ANN node and its source connected at the DNG node. Its gate is connected to the circuit's output at "z".

The ANN node is also connected as an input to the gate of screening transistor Q4. The source of screening transistor Q4 is connected to the DNG node, which is also connected to the drain of evaluate transistor Q5. The gate of evaluate transistor Q5 is connected to the clock signal, and its source is connected to ground.

The drain of screening transistor Q4 serves as a second precharged node NOH that is inversely based on the precharged node at ANN during an evaluate state. The NOH node is connected to the drain of low latch transistor Q3, the input of inverter U2, and the drain of high latch transistor Q6. The source of high latch transistor Q6 is connected to the drain of high latch transistor Q7, and the source of Q7 is connected to ground. The gate of high latch transistor Q7 is connected to the clock signal, and the gate of high latch transistor Q6 is connected to output node Z at inverter U2. The gate of low latch transistor Q3 is also connected to the Z output node, and its source is connected to VDD. Finally, the gate of precharged transistor Q2 is connected to the clock signal, and its source is connected to VDD.

The operation of the circuit will now be described. In the depicted embodiment, the precharge state corresponds to the clock being low, and the evaluate state corresponds to the clock being high. Thus, in the precharge state when clock is low, precharge transistors Q1 and Q2 (which are PFETs) are turned on, and evaluate transistor Q5 and high latch transistor Q7 are turned off. Since Q5 is the only possible path to ground for the precharged node ANN, node ANN is charged high with Q1 being on during the precharge state. Likewise, as a result of Q2 being on and Q7 being off, the precharge node at NOH will also be high during the precharge state. Accordingly, output Z will be low, which causes low latch transistor Q3 to be turned on and high latch transistor Q6 to be turned off, which is consistent with NOH being high. As will be addressed in greater detail below, low and high latch transistors Q3, Q6, respectively, serve as output latches for latching the NOH node and thereby latching the output at Z during the evaluate state. It is noted that precharge circuit 100 provides a monotonic output at Z. That is, during a transition from the precharge to evaluate state, the output can only change in one direction. In the depicted embodiment, output Z is always low during the precharge state and thus can either only transition from low to high or remain low during the evaluate state. With circuit 100, if output Z stays low, the circuit has evaluated False. Conversely, if it transitions from low to high, the circuit has evaluated True.

The operation of the circuit in the evaluate state will now be described. For a short time after the clock transitions to the evaluate state, the ANN precharged node stays high if the A and B inputs are both low during the clock transition. This corresponds to a True evaluation, and it causes the Z output to transition from low to high. Conversely, the ANN node goes low almost concurrently with the clock's transition to the evaluate state if either A or B is high upon this transition. This corresponds to a False evaluation, and it causes the output at Z to remain low.

Figure 2A:
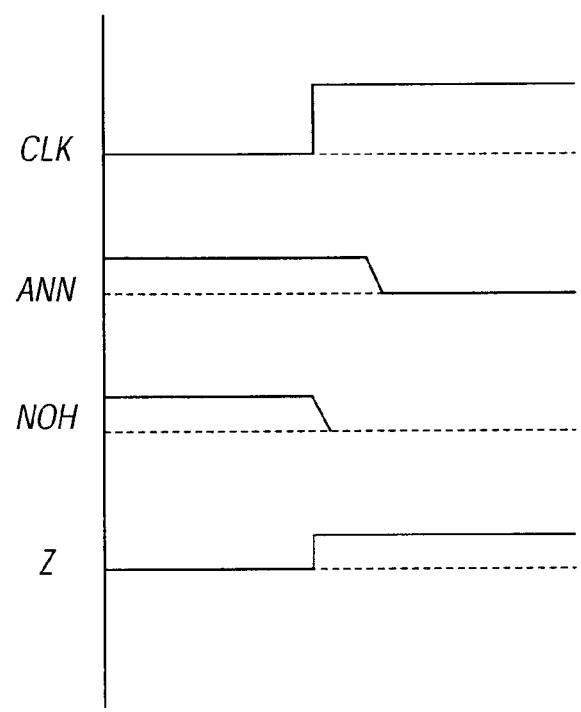
FIG. 2A shows a timing diagram of signals in the circuit of FIG. 1 upon a true evaluation.

The case where the circuit evaluates True will now be described. For this case, reference may also be made to FIG. 2A. With the clock transitioning from low to high, precharge transistors Q1 and Q2 turn off, and evaluate transistor Q5 and high latch transistor Q7 turn on. When both inputs and A and B are low, neither transistor Q10 or Q11 turns on, which allows the charge at the ANN precharge node to persist and maintain its high value long enough to turn on screening transistor Q4. Since evaluate transistor Q5 is also now turned on, with the clock going from low to high, the charge at precharged node NOH is discharged through Q4 and Q5, which causes NOH to go low. This causes the output at Z to switch to a high value, which corresponds to its True evaluation.

The high value at Z turns on the high latch transistor Q6. With Q7 also being on at this time (with the clock going high) a direct alternative ground path is provided to NOH by high latch transistors Q6 and Q7, which causes NOH to stay low whether or not Q4 stays on. Thus, as their names imply, high latch transistors Q6, Q7 serve as a latch for latching output Z high regardless of what happens with the inputs at A and B after the clock transitions to the evaluate state. All that is required for the circuit to properly evaluate high is for the A and B inputs to be low when the clock transitions to the evaluate state.

Once Z goes high, clamping transistor Q9 turns on. This clamps the ANN node down to a low value for the remainder of the evaluate state, which makes the circuit more stable.

Figure 2B:
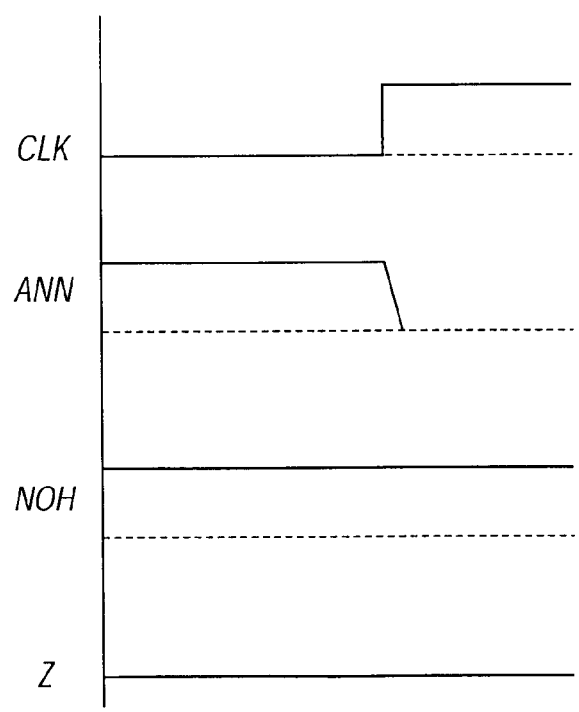
FIG. 2B shows a timing diagram of signals in the circuit of FIG. 1 upon a false evaluation.

With reference to FIGS. 1 and 2B, the case where the circuit evaluates False will be discussed. Again, with the clock transitioning from low to high, precharge transistors Q1 and Q2 turn off, and evaluate transistor Q5 and high latch transistor Q7 turn on.

If either or both of the A and B inputs are high, one or both of transistors Q10 and Q11 turn on, which causes the ANN precharged node to discharge through evaluate transistor Q5. This results in the ANN node going low. This occurs as soon as the evaluate transistor Q5 turns on because the activated logic section transistor(s) (Q10, Q11) is turned on by A and/or B at least just prior to the transition. In fact, ANN goes low quickly enough to turn off screening transistor Q4 before it can discharge precharged node NOH through evaluate transistor Q5. With node NOH remaining high, output Z remains low, which corresponds to a False evaluation. This keeps the low latch transistor Q3 turned on, which reinforces the charge at NOH. In this way, low latch transistor Q3 functions as a latch for maintaining a low value at the output Z during the evaluate state-so long as Q4 is not turned on. This is where clamping transistor Q8 comes into play.

Clamping transistor Q8 ensures that Q4 does not turn on during this time when the output at Z is suppose to be low. With the ANN node being low during the evaluate state, the output at inverter U1 is high, which causes Q8 to turn on and clamp ANN low. This prevents it from "floating" and possibly going high if both A and B go low within the evaluate state. Thus, clamping transistor Q8 ensures that screening transistor Q4 will not turn on during the evaluate state, which would cause Z to errantly go high.

Figure 3:
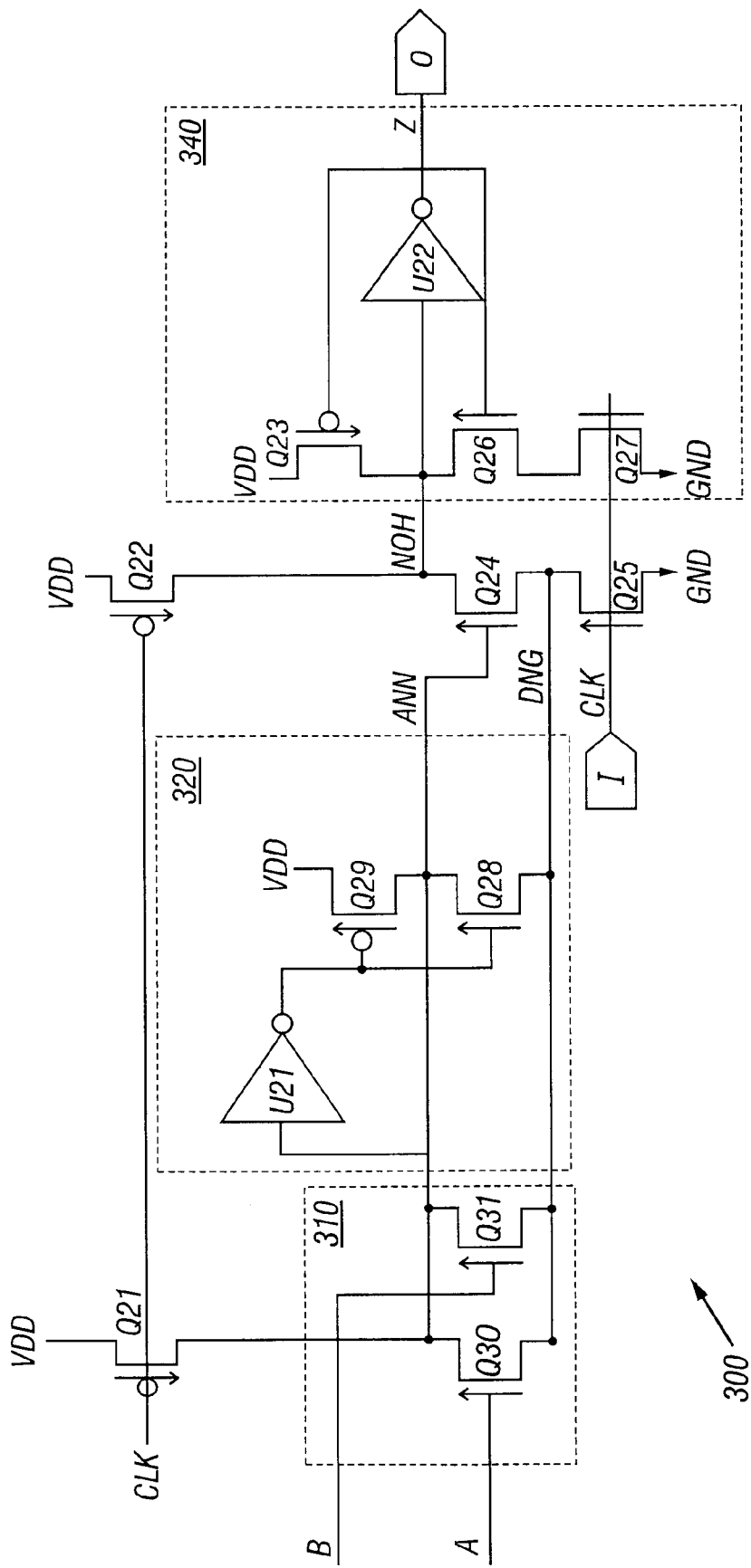
FIG. 3 schematically shows a second embodiment of the precharge circuit of the present invention.

FIG. 3 shows a preferred embodiment of a precharge circuit 300 of the present invention. Like circuit 100, precharge circuit 300 performs a NOR function with inputs at A and B and an output at Z, which is monotonic. As with circuit 100, Z is always low in the precharge state. It can only change in one direction during a transition to the evaluate state. If circuit 300 evaluates False, Z stays low, and if it evaluates True, Z changes from low to high.

Circuit 300 generally includes precharge transistors Q21 and Q22, evaluate transistor Q25, logic section 300, clamping section 320, screening transistor Q24, and an output section 340. The logic section 310, which performs a NOR gate function, includes transistors Q30 and Q31. The clamping section 320 includes inverter U21 and transistors Q28 and Q29. Finally, the output section 340 includes low latch transistor Q23, high latch transistors Q26 and Q27, and output inverter U22.

In the depicted embodiment, each of the transistors are NFET type transistors, with the exception of precharge transistors Q21 and Q22, low latch transistor Q23, and clamping transistor Q29, which are each PFET type transistors. Particular transistor types and sizes are not generally critical so long as they properly cooperate with one another. However, in the depicted embodiment's PFET/NFET implementation, Q29 is smaller than Q30 and Q31, and Q23 is smaller than Q24 and Q25.

The precharge transistor Q21 has its source connected to VDD, its drain connected to a precharged node marked ANN, and its gate connected to a clock ("CLK") signal. Within logic section 310, transistors Q30 and Q31 are connected in parallel with one another with their drains connected at the ANN node and sources connected at the node marked DNG. The gate of transistor Q30 is connected to the A input, and the gate of transistor Q31 is connected to the B input. The commonly connected sources at the DNG node are connected to the drain of evaluate transistor Q25. The gate of evaluate transistor Q25 is connected to the CLK signal, and its source is connected to ground. The ANN node is also connected to the input of inverter U21. The output of U21 is connected to the commonly-connected gates of clamping transistors Q28 and Q29, which are connected to one another in an inverted stacked configuration. Their commonly connected drains are connected to the ANN precharged node. The source of Q29 is connected to VDD, and the source of Q28 is connected to the DNG node.

The ANN node is also connected to the gate of screening transistor Q24. The source of screening transistor Q24 is connected to the drain of evaluate transistor Q25, which is at the DNG node. The drain of screening transistor Q24 defines a second precharged node marked NOH. This NOH node is connected to the drains of precharge transistor Q22, low latch transistor Q23, and high latch transistor Q26. It is also connected to the input of output inverter U22. The output of output inverter U22 defines the output of circuit 300 and is marked Z. This Z output is connected to the gates of low latch transistor Q23 and high latch transistor Q26. Finally, the drain of high latch transistor Q27 is connected to the source of high latch transistor Q26, and the source of high latch transistor Q27 is connected to ground.

The operation of circuit 300 will now be discussed. Precharge circuit 300 is fairly similar to precharge circuit 100, except that it includes a PFET type clamping transistor Q29 for holding up the ANN charge throughout the evaluate state when it is to turn on screening transistor Q24.

Again, in the depicted embodiment, the precharge state occurs when the clock is low, and the evaluate state occurs when the clock is high. With circuit 300 being edge-triggered (as was circuit 100)), the output at Z is based on the input values at A and B when the clock transitions from its low phase (precharge state) to its high phase (evaluate state).

In the precharge state with the clock being low, precharge transistors Q21 and Q22 are turned on, and evaluate transistor Q25 and high latch transistor Q27 are turned off. Thus, during the precharge state, the ANN and NOH precharged nodes are charged to high values. With NOH being high, output Z is low during the precharge state.

Figure 4A:
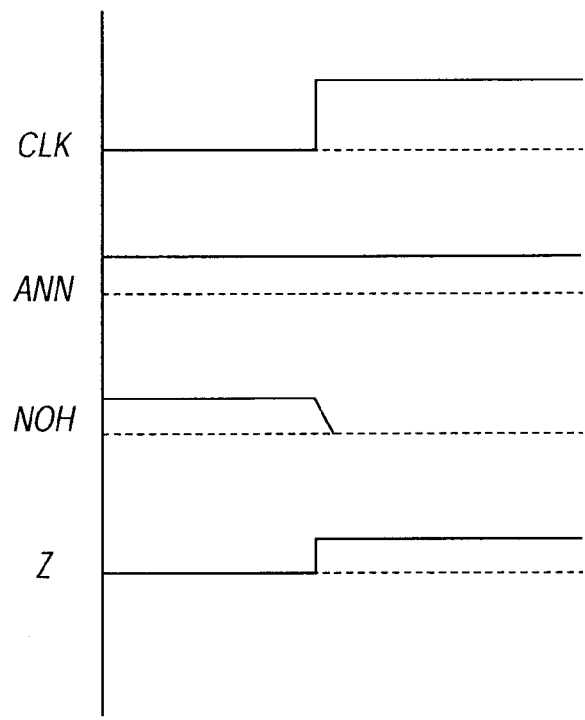
FIG. 4A shows a timing diagram of signals in the circuit of FIG. 3 upon a true evaluation.

With additional reference to FIG. 4A, the operation of circuit 300 will be described for the case when it evaluates true. This occurs when both A and B are low causing the ANN precharge node to be high during the evaluate transition from the precharge state. When the clock transitions from low to high, precharge transistors Q21 and Q22 are turned off, and evaluate transistor Q25 and high latch transistor Q27 turn on. With both Q30 and Q31 turned off, precharged node ANN remains charged to a high value. This causes screening transistor Q24 to turn on and provide precharge node NOH with a path to ground through evaluate transistor Q25. This causes the precharge node NOH to discharge to a low value. As a result, output Z goes from low to high, which turns off low latch transistor Q23 and turns on high latch transistor Q26. Thus, an additional ground path is provided to precharge node NOH through high latch transistors Q26 and Q27. Thus, once Z goes high, high latch transistors Q26 and Q27 latch precharge node NOH low (which latches Z high) during the evaluate state regardless of whether Q24 stays on or not. In other words, the NOH precharge node stays low regardless of what happens at inputs A and B during the evaluate state.

An important aspect of circuit 300 is the operation of clamping PFET Q29 for this True evaluation case when ANN is high. With ANN being high, inverter U21 generates a low at its output, which turns on clamping transistor Q29. This assists ANN in turning on the screening transistor Q24. This counters problematic capacitive coupling effects within screening transistor Q24. With advanced circuits, which have very small transistors, the effects of capacitive parasitics can be magnified. NFET Q24 can have relatively significant capacitances between its drain and gate and between its gate and source. When the clock transitions from low to high, the NOH and DNG nodes go from high to low at approximately the same time, which induces capacitive charge sharing at its gate. This causes the voltage at ANN to droop. If the droop is severe enough, screening transistor Q24 may not be on long enough to sufficiently discharge precharge node NOH, which would cause the output at Z to errantly stay low. However, with clamping transistor Q29 turned on when ANN is high, any necessary additional charge is supplied to the gate at screening transistor Q24 to ensure that it properly turns on to discharge precharged node NOH.

Figure 4B:
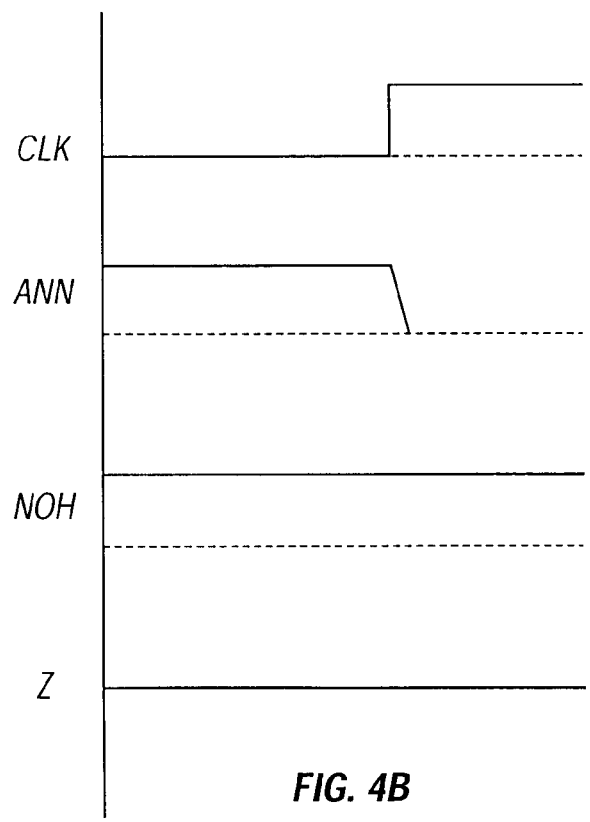
FIG. 4B shows a timing diagram of signals in the circuit of FIG. 3 upon a false evaluation.

With additional reference to FIG. 4B, the case where circuit 300 evaluates False will be discussed. This corresponds to either of inputs A or B being high, which corresponds to either transistor Q30 or Q31 being turned on. With either of these transistors on, a discharge path through evaluate transistor Q25 is provided to precharged node ANN when the clock transitions to the evaluate phase. This causes ANN to go low during this transition. With ANN going low, Q24 is turned off, which allows the charge at recharge node NOH to persist and remain at a high value. This causes the output at Z to remain low during the evaluate state, which keeps low latch transistor Q23 turned on and high latch transistor Q26 turned off. This latches node NOH low so long as Q4 remains off.

Clamping transistor Q28 operates in the same way as clamping transistor Q8 from circuit 100. With ANN being low, inverter U21 provides a high at its output, which turns on clamping transistor Q28. This clamps ANN low and prevents screening transistor Q24 from inadvertently turning on and discharging node NOH. Thus, clamping transistor Q28 serves as a latch for holding the output at Z low when the circuit is to evaluate False. In this way, the low output at Z is captured and maintained as long as either or both of inputs A and B are high when the clock transitions to the evaluate state.

The present invention provides a precharge 1 circuit that is capable of latching an output based on logical inputs during the transition from a precharge to an evaluate state. Stable input signals for the duration of the evaluate state are not required. Accordingly, separate latches for each input are not needed, which reduces the size and complexity of an IC implementation thereof.

It should be recognized that while logic sections have been described that perform NOR functions, any logical function may be implemented within the logical section and the overall precharge circuit. For example, if the inputs to A and B are inverted, the NOR gate logical section becomes an AND section. In addition, for convenience, only two inputs (A, B) have been used. However, skilled persons will recognize that any number of inputs can be attained by incorporating additional transistors into the logic section. For example, if a 32 bit decoder is desired, a logic section with 32 parallel-configured transistors could be utilized.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A precharge circuit comprising:
    a logic section having one or more inputs and a first precharged node that is charged high during a precharge state and in response to a transition to an evaluate state remains high with a unique combination of the one or more inputs, and discharges low for the other one or more input combinations;
    a screening device operably connected to the logic section, the screening device having a second precharged node with a value in the evaluate state that is based on the first precharged node when the circuit transitions to the evaluate state;
    an output whose value is based on the value of the second precharged node, whereby the value of the output is based on the one or more inputs when the circuit transitions from the precharge to the evaluate state;
    a first latching device for latching the second precharge node at its correct logical value in response to the transition, wherein the latching device maintains the low correct value in the evaluate state without regard to the one or more inputs; and
    a clamping device for clamping the screening device off after the circuit transitions to the evaluate state.

2. The circuit of claim 1 wherein the clamping device prevents the screening device from discharging the second precharge node when it is at a high value in response to the transition without regard to the one or more inputs during the evaluate state.

3. The circuit of claim 1 further comprising a second latching device for latching the first precharge node to a low value when it is low in response to the transition.

4. A precharge circuit for a microprocessor comprising:
    a logic section having one or more inputs and a first precharged node that is charged high during a precharge state and in response to a transition to an evaluate state remains high with a unique combination of the one or more inputs, and discharges low for the other one or more input combinations;
    a screening device operably connected to the logic section, the screening device having a second precharged node with a value in the evaluate state that is based on the first precharged node when the circuit transitions to the evaluate state;

an output whose value is based on the value of the second precharged node, whereby the value of the output is based on the one or more inputs when the circuit transitions from the precharge to the evaluate state; and a first clamping device for clamping the screening device off after the circuit transitions to the evaluate state.

5. The circuit of claim 4 wherein the second precharged node is charged high during the precharge state and discharges to a low value when the first precharged node remains high in response to the transition, and remains charged high when the first precharged node discharges to a low value in response to the transition.

6. The circuit of claim 5 wherein the first clamping device prevents the screening device from discharging the second precharge node when it is at a high value in response to the transition without regard to the one or more inputs during the evaluate state.

7. The circuit of claim 6 further comprising a second clamping device for clamping the screening device off after it has discharged the second precharged node in response to the transition.

8. The circuit of claim 4 further comprising a first latching device for latching the second precharge node to a low value when it is low in response to the transition, wherein the latching device maintains the low value in the evaluate state without regard to the one or more inputs.

9. The circuit of claim 8 wherein the first latch device comprises a transistor operably connected to the second precharged node to provide a discharge path in response to the second precharged node being low.

10. The circuit of claim 9 wherein the first latch device includes first and second transistors connected in series between the second precharged node and a ground, the first transistor being on in the evaluate state and off in the precharge state and the second transistor being on when the second precharged node is low and off when it is charged high.

11. The circuit of claim 5 further comprising a second clamping device for turning the screening device on when it is to discharge the second precharged node.

12. The circuit of claim 8 further comprising a second latching device for latching the first precharge node to a low value when it is low in response to the transition.

13. A precharge circuit comprising:

a logic section having one or more inputs and a first precharged node that is charged high during a precharge state and in response to a transition to an evaluate state remains high with a unique combination of the one or more inputs, and discharges low for the other one or more input combinations;

a screening device operably connected to the logic section, the screening device having a second precharged node with a value in the evaluate state that is based on the first precharged node when the circuit transitions to the evaluate state;

an output whose value is based on the value of the second precharged node, whereby the value of the output is based on the one or more inputs when the circuit transitions from the precharge to the evaluate state;

a first latching device for latching the second precharge node at its correct logical value in response to the transition, wherein the latching device maintains the low correct value in the evaluate state without regard to the one or more inputs; and a second latching device for latching the first precharge node to a low value when it is low in response to the transition.

14. The circuit claim 13 wherein the first latching device provides a discharge path in response to the second precharged node being low.

15. The circuit of claim 13 wherein the second precharged node is charged high during the precharge state and discharges to a low value when the first precharged node remains high in response to the transition, and remains charged high when the first precharged node discharges to a low value in response to the transition.

16. The circuit of claim 15 wherein the screening device includes an NFET type transistor having a gate connected to the first precharged node and a drain for the second precharged node.

17. The circuit of claim 13 wherein the logic section comprises one or more parallel configured transistors corresponding to the one or more inputs.

18. The circuit of claim 17 wherein the one or more transistors are NFET transistors with their drains connected to one another and defining the first precharge node.

19. The circuit of claim 13 wherein the first latch device comprises a transistor operably connected to the second precharged node to provide the discharge path in response to the second precharged node being low.

20. The circuit of claim 19 wherein the first latch device includes first and second transistors connected in series between the second precharged node and a ground, the first transistor being on in the evaluate state and off in the precharge state and the second transistor being on when the second precharged node is low and off when it is charged high.

21. The circuit of claim 13 further comprising an output inverter connected between the second precharged node and the circuit output, whereby the value of the circuit output is the inverted value of the second precharged node.

22. The circuit of claim 21 wherein the first latch device includes an NFET type transistor that is connected to the second precharged node for providing it a discharge pathway, wherein the NFET device has a gate that is connected to the circuit output.

23. The circuit of claim 13 wherein the screening device includes a PFET type device having a gate connected to the first precharged node and a source for the second precharged node.

* * * * *